United States Patent
Toyoda et al.

(10) Patent No.: US 7,515,890 B2
(45) Date of Patent: Apr. 7, 2009

(54) RADIO RECEIVER AND RADIO RECEIVING METHOD

(75) Inventors: Takehiko Toyoda, Tokyo (JP); Hiroshi Yoshida, Yokohama (JP); Takayuki Kato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 538 days.

(21) Appl. No.: 11/280,331

(22) Filed: Nov. 17, 2005

(65) Prior Publication Data

US 2006/0068735 A1    Mar. 30, 2006

Related U.S. Application Data

(63) Continuation of application No. 10/327,104, filed on Dec. 24, 2002, now Pat. No. 7,272,371.

(30) Foreign Application Priority Data

Dec. 25, 2001 (JP) ............................. 2001-390931

(51) Int. Cl.
*H04B 1/06* (2006.01)
*H04B 7/00* (2006.01)
(52) U.S. Cl. ............... 455/239.1; 455/235.1; 455/240.1
(58) Field of Classification Search .............. 455/230, 455/231, 232.1, 234.1, 234.2, 235.1, 239.1, 455/240.1, 241.1
See application file for complete search history.

(56) References Cited

U.S. PATENT DOCUMENTS

| 6,088,583 | A | 7/2000 | Shimizu et al. |
| 6,122,331 | A | 9/2000 | Dumas |
| 6,163,685 | A | 12/2000 | Dilling et al. |
| 6,205,189 | B1 | 3/2001 | Ha |
| 6,324,387 | B1 | 11/2001 | Kamgar et al. |

(Continued)

FOREIGN PATENT DOCUMENTS

CN    1202767 A    12/1998

(Continued)

OTHER PUBLICATIONS

U.S. Appl. No. 10/819,288, filed Apr. 7, 2004, Sekiguchi et al.

(Continued)

*Primary Examiner*—Edward Urban
*Assistant Examiner*—Christian A Hannon
(74) *Attorney, Agent, or Firm*—Oblon, Spivak, McClelland, Maier & Neustadt, P.C.

(57) ABSTRACT

A radio receiver comprises an LNA which amplifies An RF signal, a quadrature demodulator which directly demodulates the amplified RF signal into a B/B signal, using a LO signal, a VGA which amplifies the B/B signal, a DC offset canceller which executes feedback control on the amplified B/B signal, and a gain controller which controls at least the gain of the LNA, the gain controller including a signal intensity detector which detects the intensity of the amplified B/B signal, a gain selector which selects a desired one of preset gains on the basis of the detected intensity, a timing controller which controls timing of switching to the selected desired gain, and a gain control signal generator which changes, in accordance with the controlled timing, the interval at which an LNA gain control signal is generated.

4 Claims, 7 Drawing Sheets

U.S. PATENT DOCUMENTS

| | | |
|---|---|---|
| 6,392,479 B2 | 5/2002 | Miura |
| 6,408,168 B1 | 6/2002 | Sessink |
| 6,459,889 B1 | 10/2002 | Ruelke |
| 6,560,448 B1 * | 5/2003 | Baldwin et al. .......... 455/234.1 |
| 6,563,891 B1 * | 5/2003 | Eriksson et al. ............. 375/345 |
| 2005/0009489 A1 | 1/2005 | Sekiguchi et al. |

FOREIGN PATENT DOCUMENTS

| | | |
|---|---|---|
| EP | 0865165 | 9/1998 |
| EP | 1402631 | 3/2004 |
| WO | WO 95/30275 | 11/1995 |

OTHER PUBLICATIONS

U.S. Appl. No. 11/280,331, filed Nov. 17, 2005, Toyoda et al.

Hiroshi Tanimoto, "Mission Impossible? A Review of Mixers for Direct-Conversion Receivers", IEICE Trans. Election, vol. J84-C, No. 5 May 2001, pp. 337-348.

* cited by examiner

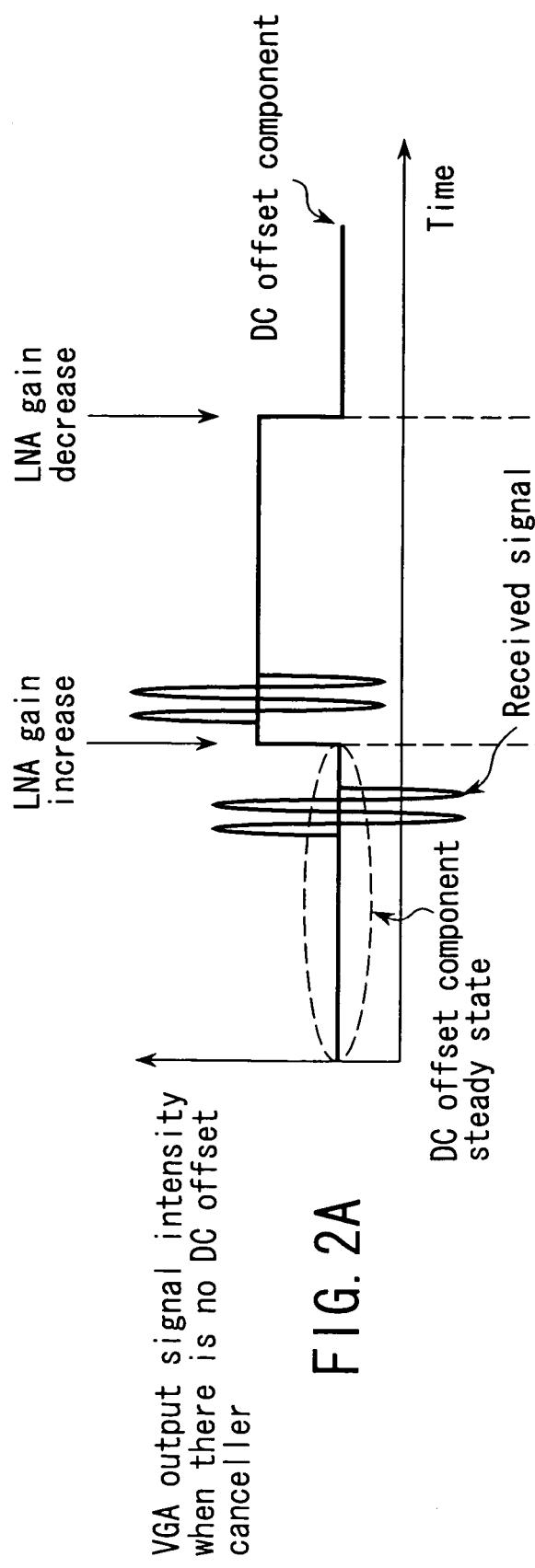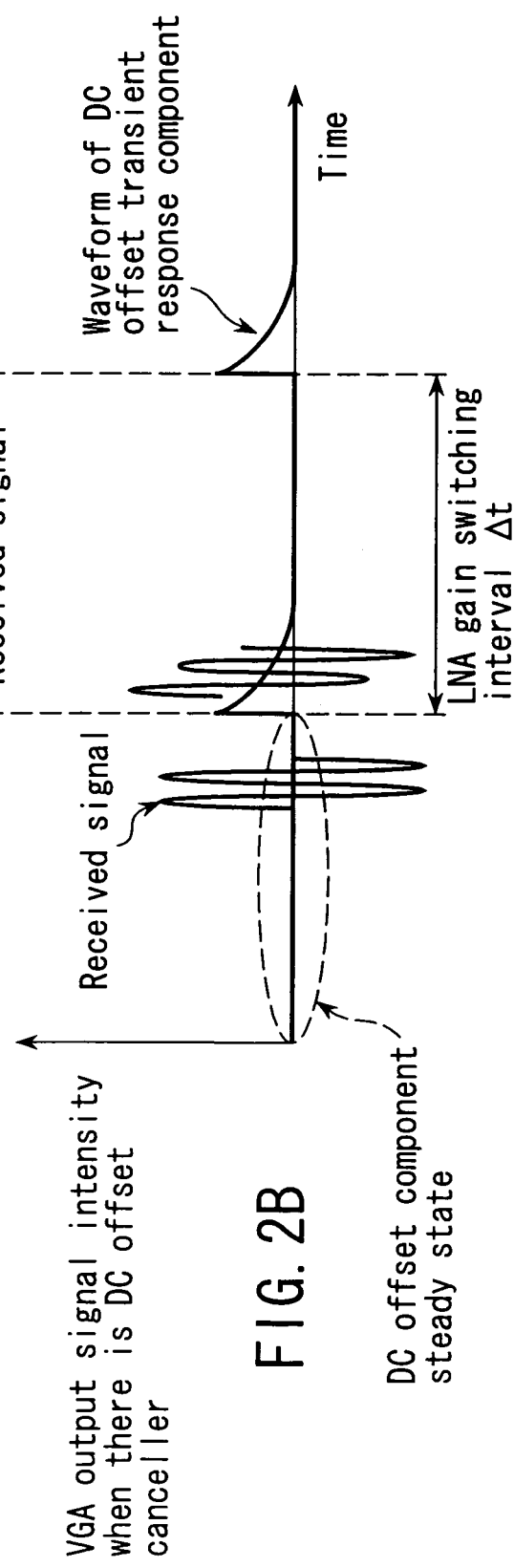
FIG. 2A
FIG. 2B

RADIO RECEIVER AND RADIO RECEIVING METHOD

CROSS-REFERENCE TO RELATED APPLICATIONS

This application is a continuation of co-pending U.S. patent application Ser. No. 10/327,104, filed Dec. 24, 2002, which is based upon and claims the benefit of priority from the prior Japanese Patent Application No. 2001-390931, filed Dec. 25, 2001, the entire contents of each of which are incorporated herein by reference.

BACKGROUND OF THE INVENTION

1. Field of the Invention

The present invention relates to a radio receiver of a direct-conversion system, and more particularly to a radio receiver of a direct-conversion system that contains a DC-offset canceller.

2. Description of the Related Art

In radio communication apparatuses, practical application of a direct-conversion system, in which a radio frequency (RF) signal is multiplied by a local oscillation signal of the same frequency to directly extract a baseband signal (B/B signal), has recently been adopted since the system can reduce the number of components and cost and can easily realize monolithic ICs.

However, in direct-conversion receivers, a DC offset component may involve a serious problem. As described in "Mission Impossible? A Review of Mixers for Direct-Conversion Receivers" written by Hiroshi Tanimoto in Papers of the Institute of Electronics, Information and Communications Engineering, Vol. J84-C No. 5, pp. 337-348, May of 2001", since the receiving frequency is identical to the local oscillation frequency in direct-conversion receivers, the frequency of the local oscillation signal is in the pass band of a low noise amplifier (LNA) or antenna, and hence the local oscillation signal cannot be completely isolated from a received signal. Accordingly, the local oscillation signal leaks to the antenna or LNA, and the leakage component is input to a quadrature demodulator, where it is subjected to frequency conversion and a DC offset component is generated. This is the problem called "DC offset", due to self-mixing of the local oscillation signal.

Further, since the receivers generally need to process received signals of frequencies that fall within a dynamic range of 100 dB, the LNA needs to switch preset gains in a stepwise manner. During switching the gains, the impedance of the LNA against the impedance of the quadrature demodulator inevitably varies. Therefore, the leakage component of the local oscillation signal varies as a result of the gain switching of the LNA, and the DC offset component due to self-mixing of the local oscillation signal also varies.

Furthermore, in addition to the DC offset component due to self-mixing, the quadrature demodulator, low-pass filter, variable gain amplifier (VGA) of the receiver have their respective offset components due to, for example, variations in circuit forming elements.

The DC offset components may change the dynamic range of the receiver, which causes saturation of the received signal and degrading of the receiving characteristics. To avoid this, the receiver of the direct-conversion system needs to eliminate the DC offset components, using a DC offset canceller.

In general, the DC offset components caused by variations in circuit forming elements have substantially the same level all the time, and hence can be easily eliminated by a DC offset canceller for eliminating a DC component of a predetermined level. On the other hand, the DC offset component caused by self-mixing varies as a result of stepwise gain switching of the LNA of the receiver, and the variation range is too large to ignore, compared to the amplitude of the received signal. Therefore, it is difficult to eliminate, using the DC canceller for eliminating a DC offset component of a fixed level, the varying DC offset component generated during, for example, gain switching of the LNA. The varying DC offset component requires a new type of DC canceller that can execute feedback control while detecting fluctuations in the received signal.

In the direct-conversion receiver, when the intensity of the received signal is close to the gain switching level of the LNA, the gain switching of the LNA is frequently executed by a gain control signal. Therefore, the DC offset canceller cannot follow frequent changes of the DC offset component that greatly varies in a stepwise manner. As a result, the residual DC offset component of the VGA output degrades the receiving characteristics.

In particular, when signal receiving is continuously executed in a receiver in which LNA gain switching may occur during signal receiving, the DC offset component will abruptly vary due to self-mixing upon stepwise switching of the LNA gain between high and low gains. As a result, as aforementioned, the impedance of the LNA against the impedance of the quadrature demodulator varies upon LNA gain switching, thus the residual DC offset component of the VGA output degrades the receiving characteristics, and may make it impossible to receive a signal at worst.

As stated above, the residual DC offset component depends upon the highpass characteristic of the canceller circuit structure. In light of this, if the cutoff frequency of the highpass characteristic is increased, the convergence time of the DC offset transient response component can be shortened. In this case, however, necessary signal components are also cut, which degrades the receiving characteristic and makes it impossible to receive a signal at worst.

As described above, in a DC offset canceller necessary to realize a direct-conversion receiver, if the interval of occurrence of the transient response component is short because the LNA gain switching occurs frequently, the baseband signal cannot be digitally demodulated. Further, also if the initial maximum value of the DC offset transient response component of the VGA output is too high, the baseband signal cannot be digitally demodulated.

BRIEF SUMMARY OF THE INVENTION

The present invention has been developed to solve the above problems, and aims to provide a radio receiver of a direct-conversion system in which degradation of its receiving characteristic due to the DC offset transient response component of a VGA output can be suppressed within an allowable range as a standard for radio communication systems, and also to provide a radio receiving method for use in the receiver.

To satisfy the aim, according to an aspect of the invention, there is provided a radio receiver comprising: a low noise amplifier which amplifies a radio signal; a quadrature demodulator which directly demodulates the radio signal amplified into a baseband signal; a variable gain amplifier which amplifies the baseband signal; an executing unit configured to execute feedback control on the baseband signal amplified; and a gain controller which controls a gain of the low noise amplifier, the gain controller comprising: a signal intensity detector which detects an intensity of the baseband signal amplified; a gain selector which selects a desired preset gain from a plurality of preset gains which are set for the low noise amplifier, based on the intensity detected; a timing controller which controls timing of switching the gain to the desired preset gain selected; and a gain control signal output unit configured to output a gain control signal to the low noise amplifier at a time-interval according to the timing controlled.

According to another aspect of the invention, there is provided a radio receiving method comprising: amplifying a radio signal; directly demodulating the radio signal amplified into a baseband signal; amplifying the baseband signal; executing feedback control on the baseband signal amplified; detecting an intensity of the baseband signal amplified; selecting a desired preset gain from a plurality of preset gains based on the intensity detected; controlling timing of switching the gain to the desired preset gain selected; and outputting a gain control signal at a time-interval according to the timing controlled.

BRIEF DESCRIPTION OF THE SEVERAL VIEWS OF THE DRAWING

FIGS. 2A and 2B are graphs useful in explaining the residual DC offset component of a direct-conversion receiver containing a DC offset canceller;

DETAILED DESCRIPTION OF THE INVENTION

Figure 1:
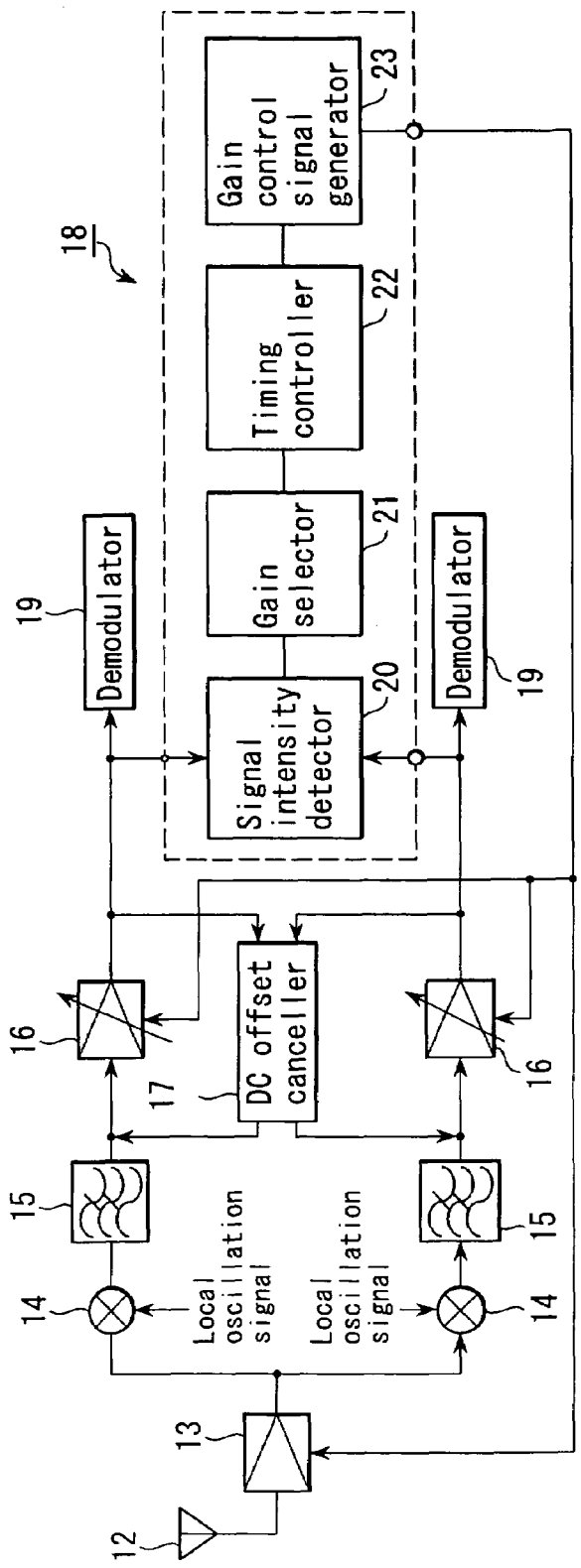
FIG. 1 is a block diagram illustrating a direct-conversion receiver according to an embodiment of the invention.

FIG. 1 is a block diagram illustrating a direct-conversion receiver according to an embodiment of the invention. This embodiment is characterized in that a gain controller 18 for controlling gain switching of a low noise amplifier (LNA) 13 and variable gain amplifier (VGA) 16 is provided with a timing controller 22 for controlling the generation timing of LNA and VGA gain control signals.

The receiver of the embodiment of the invention comprises: an antenna 12 for receiving a radio frequency (RF) signal; a low noise amplifier (LNA) 13 for amplifying the received RF signal; a quadrature demodulator 14 for directly demodulating the amplified RF signal into a baseband signal, using a local oscillation signal; a lowpass filter (LPF) 15 for waveform-shaping the baseband signal; a variable gain amplifier (VGA) 16 for amplifying the shaped baseband signal; a DC offset canceller 17 for feedback-controlling a DC offset component contained in the output of the VGA 16; a gain controller 18 for inputting a signal output from the VGA 16 and controlling the gain switching of the LNA 13 and VGA 16; and a demodulator 19 for inputting the signal output from the VGA 16 and digitally demodulating it. The gain controller 18 includes: a signal intensity detector 20 for detecting the intensity of the signal output from the VGA 16; a gain selector 21 for selecting the gains of the LNA 13 and VGA 16 on the basis of the detected signal intensity; a timing controller 22 for controlling the timing of switchover to the gain selected by the gain selector 21; and a gain control signal generator 23 for changing the interval of generation of gain control signals in accordance with the timing controlled by the timing controller 22.

As an example of the DC offset canceller 17, a circuit configuration, in which an amplifier of a fixed gain and a lowpass filter are connected by cascade connection, is used.

The operation of the receiver will now be described. The RF signal received by the antenna 12 is amplified by the LNA 13, and is then input to the quadrature demodulator 14 where it is multiplied by a local oscillation signal output from a local oscillator (not shown), thus directly converted into a baseband signal. The baseband signal has its waveform shaped by the LPF 15, and is input and amplified by the VGA 16. The baseband signal amplified by the VGA 16 is input to the DC offset canceller 17, where it is subjected to feedback control executed, using, for example, an integrator (lowpass filter), for suppressing the DC offset component contained therein. After that, the baseband signal is supplied to both the gain controller 18 and demodulator 19. The demodulator 19 demodulates the baseband signal into a digital signal. The gain controller 18 detects the intensity of the baseband signal, using the signal intensity detector 20, selects the gains of the LNA 13 and VGA 16, using the gain selector 21, controls the interval of gain switching between high and low gains, using the timing controller 22, and generates gain control signals for the LNA 13 and VGA 16, using the gain control signal generator 23. Thus, feedback control is executed. For facilitating the explanation, the LNA 13 is set in the embodiment such that its gain can be switched between two stages, i.e., high and low stages. The invention is not limited to this, but the gain selector 21 may be modified to select one of three or more gains.

In the direct-conversion type, the quadrature demodulator of a receiving frequency band executes phase detection, and frequency conversion is directly executed from a high frequency band to a baseband. Accordingly, no problem will occur theoretically in relation to image signal suppression. This makes it unnecessary to use a high-frequency band image suppression filter or passive filter for intermediate-frequency channel selection, which is required in the superheterodyne system. In light of the fact that these filters have a large size and hence cannot easily be incorporated in ICs, the direct-conversion receiver, which does not require the filters, enables reduction of the number of components and cost and realization of a monolithic IC.

FIGS. 2A and 2B show the states of the DC offset component assumed when the LNA gain of the receiver of FIG. 1 has changed. In this example case, the LNA gain is changed between high and low values. FIG. 2A shows the intensity of the VGA signal output when no DC offset canceller is employed, and FIG. 2B shows that of the VGA signal output when a DC offset canceller is employed as shown in FIG. 1.

The feedback control type DC offset canceller as shown in FIG. 1 can remove the DC offset component input thereto if the DC offset component is at a constant level (the state surrounded by the broken line in FIGS. 2A and 2B). However, when the LNA gain increases and decreases in a stepwise manner as shown in FIG. 2A, the DC offset component also varies in a stepwise manner. At this time, the stepwise change of the DC offset component causes a transient response component due to the circuit structure of the DC offset canceller as shown in FIG. 2B, before the DC offset component converges in the steady state as a result of the feedback control by the DC offset canceller. Thus, the DC offset component remains until the steady state is restored.

The change with lapse of time in the DC offset transient response component of the VGA output depends upon the highpass characteristic of the entire feedback loops of the VGA and the DC offset canceller, and usually has a waveform expressed by a single exponential function. Further, the initial maximum value of the transient response component is determined directly from the width of LNA gain switching between high and low gains.

Figure 3:
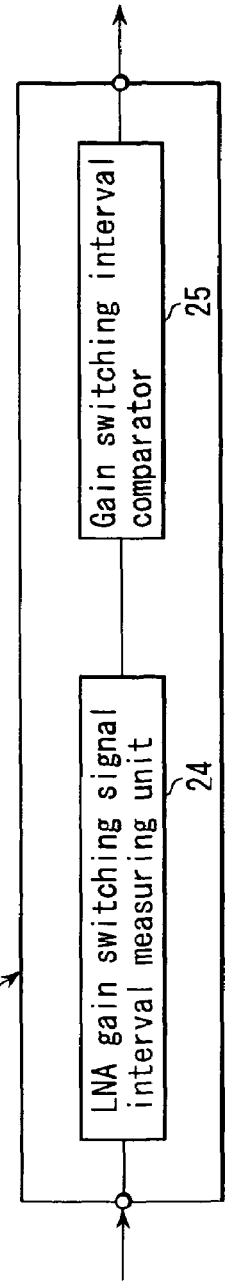
FIG. 3 is a block diagram illustrating an example of a timing controller appearing in FIG. 1.

FIG. 3 is a block diagram illustrating the timing controller 22, shown in FIG. 1, according to an embodiment of the invention. The timing controller 22 comprises an LNA gain switching signal interval measuring unit 24 and gain switching interval comparator 25.

The operation of the timing controller 22 will be described. If the received-signal intensity has crossed a predetermined LNA gain switching threshold in the gain selector 21, the LNA gain switching signal interval measuring unit 24 of the timing controller 22 measures the time interval elapsing from the previous LNA gain switching, then the gain switching interval comparator 25 compares the measurement result with the preset LNA shortest gain switching interval $\alpha$. If the measurement result of the LNA gain switching signal interval measuring unit 24 is shorter than the preset LNA shortest gain switching interval $\alpha$, the LNA gain switching is not executed, and a signal for adjusting only the VGA gain is output to the gain control signal generator 23.

(An Example of a Control Method Used in the Gain Controller 18)

Figure 4:
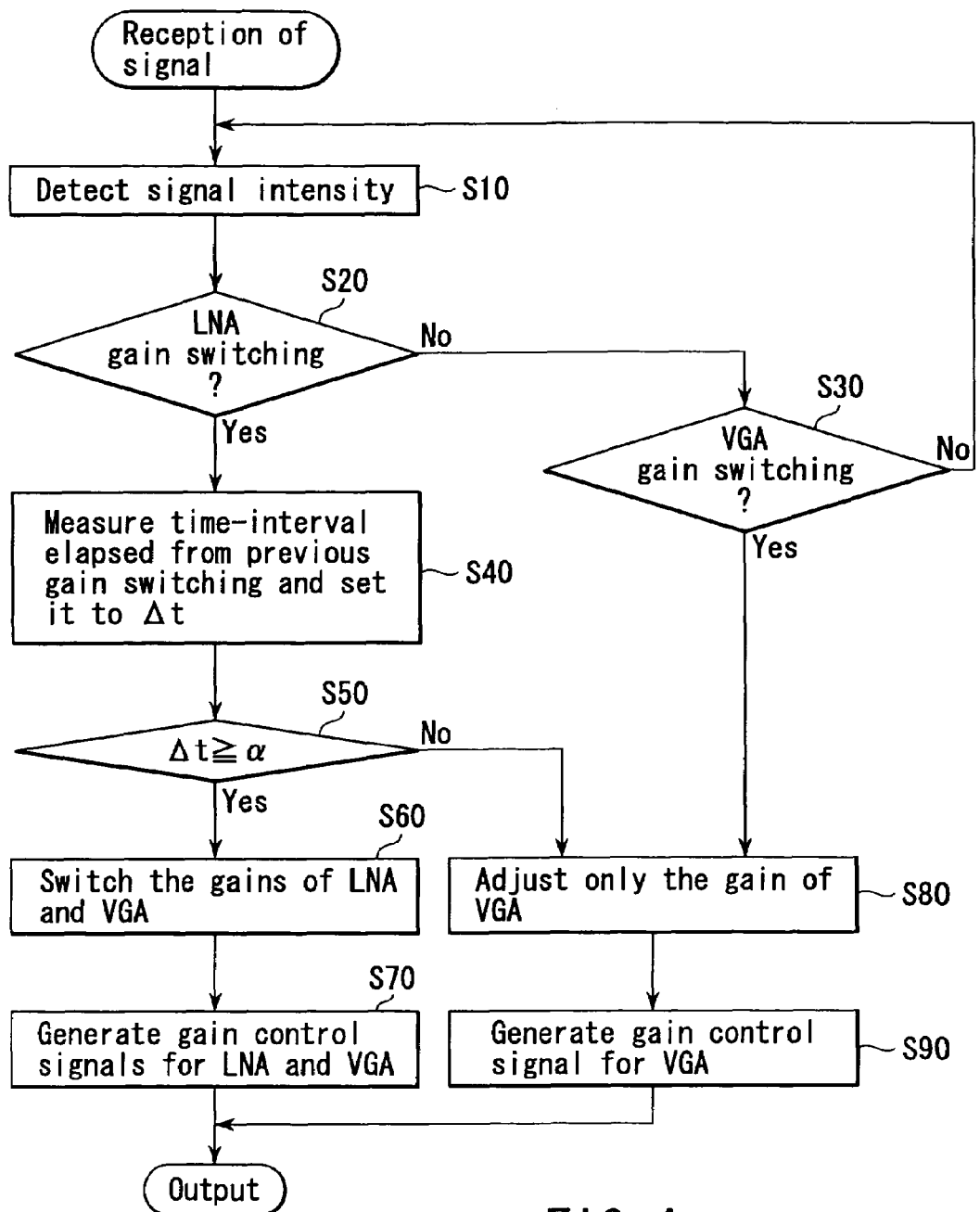
FIG. 4 is a flowchart useful in explaining an example of a control method used in a gain controller appearing in FIG. 1.

FIG. 4 is a flowchart useful in explaining an example of a control method used in the gain controller 18 appearing in FIG. 1. Firstly, the signal intensity detector 20 detects the intensity of the signal supplied from the VGA 16 shown in FIG. 1 (S10). The gain selector 21 determines, on the basis of the detected signal intensity, whether the high or low gain operation of the LNA should be executed (S20). If the signal intensity has crossed the LNA gain switching threshold value (YES at the step S20), the timing controller 22 measures the time interval elapsing from the previous LNA gain switching, using the LNA gain switching signal interval measuring unit 24, and sets the time interval as $\Delta t$ (S40). After that, $\Delta t$ is compared with the preset LNA shortest gain switching interval $\alpha$, using the gain switching interval comparator 25 (S50). If $\Delta t \geq \alpha$, the gain control signal generator 23 executes both LNA gain switching and VGA gain control (S60), and generates LNA and VGA gain control signals (S70). On the other hand, if $\Delta t < \alpha$, the gain control signal generator 23 only executes VGA gain control to execute signal intensity control (S80), and generates a VGA gain control signal (S90).

Further, if the signal intensity does not cross the LNA gain switching threshold value (NO at the step S20), and if it is necessary to execute VGA gain switching (YES at the step S30), the gain control signal generator 23 executes only VGA gain control to execute signal intensity control (S80). This is feedback control for the LNA and VGA.

In the above-described embodiment, even if the intensity of the signal output from the VGA 16 is close to the LNA gain switching level at which gain switching frequently occurs, the timing of generation of signal pulses by the gain control signal generator 23 is adjusted, using the timing controller 22, so that the pulses can be output at appropriate intervals. As a result, degradation of the received signal due to the DC offset transient response component of the VGA output is suppressed within an allowable range as a radio communication system standard.

In other words, by virtue of the timing controller provided for controlling the timing of generation of LNA gain switching signal pulses by the gain control signal generator, the interval of LNA gain switching, which frequently occurs because of, for example, fading, can be forcibly set longer, with the result that degradation of the receiving characteristic due to the DC offset transient response component is suppressed.

In the above structure, since the output of the LNA gain switching signal is forcibly limited if the intensity of the received signal is close to the LNA gain switching level, there may be a case where the LNA cannot have an appropriate gain. However, for the received signal having a intensity level close to the LNA gain switching level, gain control can be executed within the variable range set for the VGA located downstream of the LNA with respect to the signal direction. If the LNA gain switching signal is forcibly limited, the LNA can have an appropriate gain within the variable range set for the VGA, using the gain control signal generator 23.

Figure 5A:
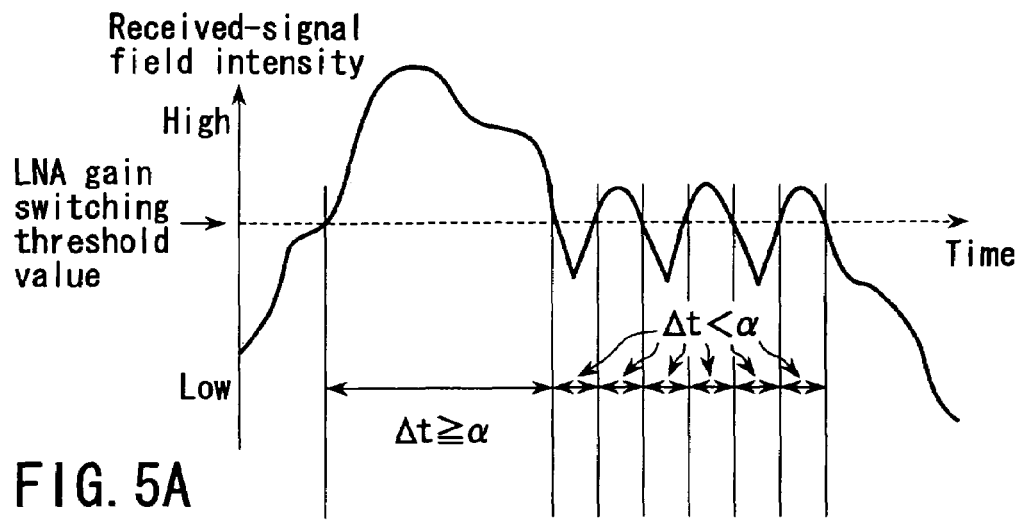
FIGS. 5A, 5B and 5C are views useful in explaining gain control executed by the timing controller upon execution of control shown in FIG. 4.
Figure 5B:
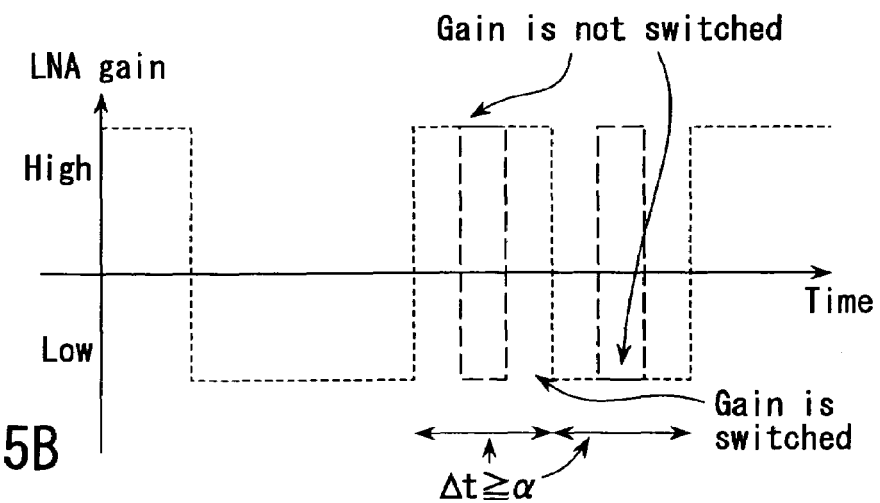
Figure 5C:
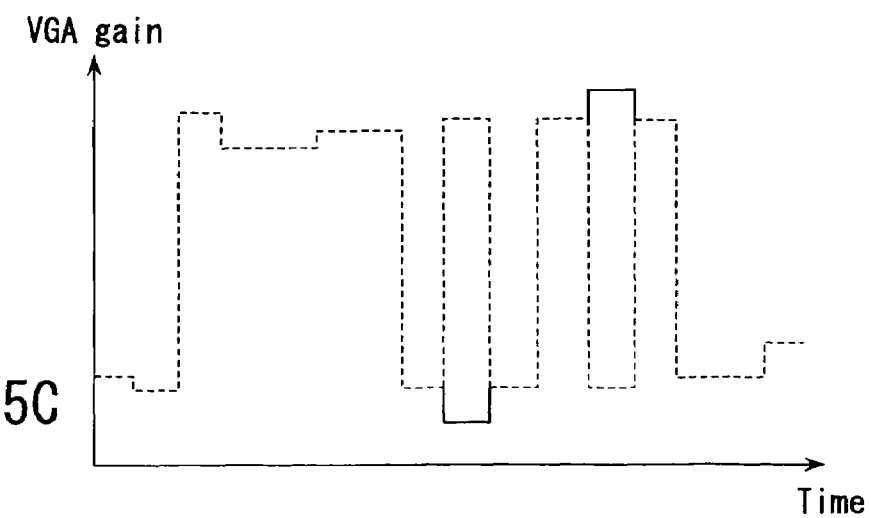

FIGS. 5A, 5B and 5C are graphs useful in explaining gain control executed by the timing controller 22 during the control operation described referring to the flowchart of FIG. 4. Specifically, FIGS. 5A, 5B and 5C show changes, with lapse of time, in the received-signal intensity, LNA gain and VGA gain, respectively. The broken line in FIG. 5A indicates the LNA gain switching threshold mentioned above with reference to FIG. 4. In FIGS. 5B and 5C, the broken lines indicate a conventional case where the LNA gain switching timing is not controlled, while the solid lines indicate the differences between the conventional case and the case of the embodiment of the invention in which timing control is executed. As shown in FIG. 4, if $\Delta t \geq \alpha$, the same gain control is executed in both cases. On the other hand, if $\Delta t < \alpha$ (NO at the step S50), the LNA gain control is not executed and only VGA gain switching control is executed as indicated by the solid lines, to deal with a dynamic range of receiving frequencies.

In general, there is a difference of about 30 dB between the high and low gains of the LNA. Further, if the LNA gain switching threshold value is set to an appropriate value, saturation of a signal due to excessive amplification, or no signal detection due to insufficient amplification can be avoided by forcibly limiting the LNA gain switching signal using the VGA output.

In other words, the timing controller 22 is used to adjust the timing of generation of the LNA gain switching signal within the signal reception allowable range of the system, so that the LNA gain switching is not executed within a predetermined time interval. At the same time, the received signal, which had to be received so far at a high gain by switching the gain of the LNA, can be amplified to the level that can be received by the VGA. On the other hand, the received signal, which had to be received so far at a low gain by switching the gain of the LNA, can be attenuated to the level that can be received by the VGA.

A method for determining the LNA shortest gain switching interval $\alpha$ will be described.

Firstly, the LNA shortest gain switching interval $\alpha$ is set to a value, at which the degree of degradation of a block error rate from the time when no DC offset transient component occurs in the VGA output is kept at 0.1 dB or less. The block error rate serves as an index for degradation of the demodulator 19. In other words, α is set to a value, which prevents the block error rate from degrading, by 0.1 dB or more, from the block error rate assumed in the demodulator when no DC offset transient component occurs in the VGA output, even if LNA gain switching is executed at the LNA shortest gain switching intervals α. This value is equal to the maximum allowable error in the measurement system based on, for example, the 3GPP stipulation specified in 3rd Generation Partnership Project "3GPP TS 34.121 V3.5.0 (2001-06) Technical Specification Group Radio Access Network: Terminal Conformance Specification: Radio Transmission and Reception (FDD) (Release 1999)" (hereinafter referred to as "TS 34.121"). In other words, this value is set such that it can be judged that the degradation of the receiving characteristic due to the DC offset transient response component is suppressed to a low degree falling within the allowable error range of the measurement system, and hence the degradation of the receiving characteristic does not occur.

Secondly, the LNA shortest gain switching interval α is set to a value 7680 times or more as long as the chip rate.

For example, in a system (W-CDMA) having a chip rate of 3.84 MHz, α is 2 msec, since α is 7680 times or more as long as the chip rate. Using a computer simulation based on 3rd Generation Partnership Project "3GPP TS 25.101 V3.6.0 (2001-03) Technical Specification Group Radio Access Network: UE Radio Transmission and Reception (FDD) (Release 1999)" (hereinafter referred to as "TS 25.101"), the above-mentioned value is calculated on condition that the degree of degradation of the block error rate is less than 0.1 dB, which is the specification value used in the second method.

Examples of simulation results obtained using the second determining method will be described.

Figure 6:
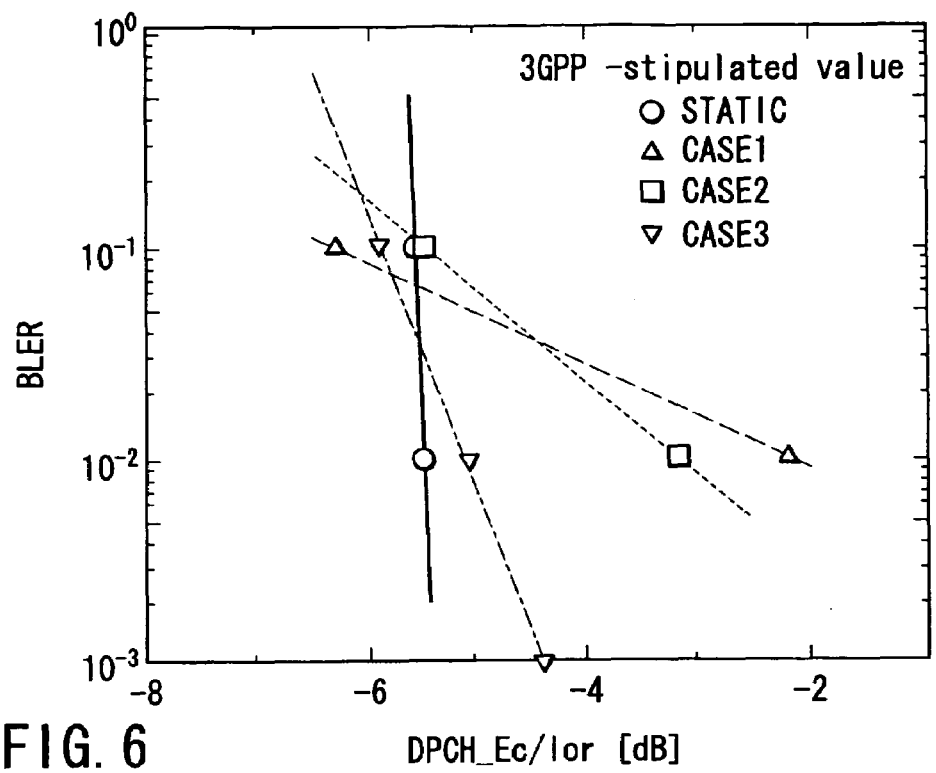
FIG. 6 is a graph useful in explaining a method for determining the LNA shortest gain switching interval α according to the embodiment of the invention, and illustrating the relationship between the power ratio (DPCH_Ec/Ior) of DPCH per one chip to the total power and the block error rate (BLER) of a demodulator.

FIG. 6 shows 3GPP TS 25.101-stipulated values of the propagation characteristic in static and multi-pass fading states assumed when the data rate is 384 kbps. FIG. 6 shows the relationship between the power ratio (DPCH_Ec/Ior) of a desired wave level (DPCH_Ec) to the total power per one chip of a level (Ior) of a wave including an interference wave, and the block error rate (BLER) of the demodulator 19. In FIG. 6, in general, the slower the Doppler velocity, the more gentle the inclination of each line, and the higher the degree of degradation of the block error rate. Specifically, if the inclination is sharp, DPCH_Ec/Ior [dB] little changes along the horizontal axis even if BLER degrades along the vertical axis. On the other hand, if the inclination is gentle, DPCH_Ec/Ior [dB] significantly changes along the horizontal axis when BLER degrades by a small amount along the vertical axis. The value along the coordinate indicates the degree of degradation [dB] of the block error rate.

Figure 7:
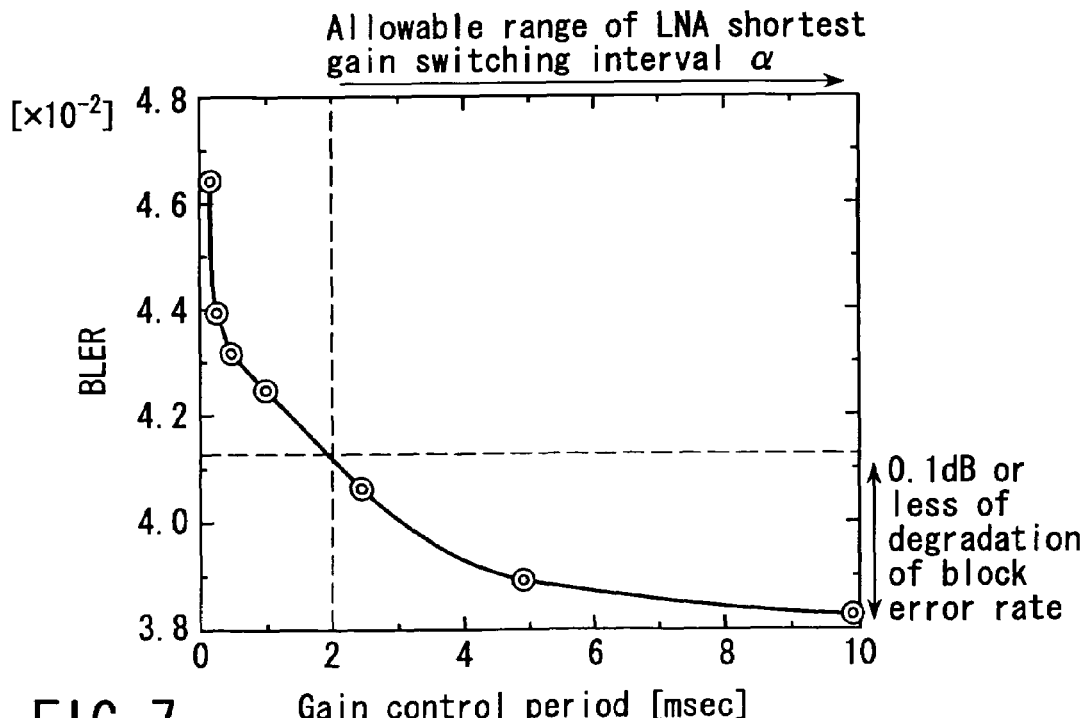
FIG. 7 is a graph useful in explaining a method for determining the LNA shortest gain switching interval α according to the embodiment of the invention, and illustrating the relationship between BLER and the LNA shortest gain switching interval, the relationship being obtained by superimposing a DC offset transient response component upon a received signal, and changing the LNA shortest gain switching interval.

FIG. 7 shows the results of simulation concerning the relationship between the BLER and LNA shortest gain switching interval, the relationship being acquired by causing an ideal receiver to superimpose the DC offset transient response component upon a received signal, and to change the LNA shortest gain switching interval. The ideal receiver means a receiver which is realized under the conditions that the data rate is 384 kbps and case 1 occurs (under which the degradation of the BLER is most conspicuous as explained with reference to FIG. 6), and in which the channel response is known, the quantization and the like are not degraded, and no DC offset transient response component occurs in the VGA output. Further, in the simulation, the DC offset transient response component is expressed using a single exponential function, and the cutoff frequency of the highpass characteristic is set to 10 kHz. The transient response assumed here is a characteristic of the feedback loop of a general VGA and DC offset canceller having primary highpass filter characteristics. Further, the reason why the cutoff frequency is set to 10 kHz is that it is the highest one of the frequencies at which any necessary signal is not cut. If the cutoff frequency is set to a value higher than that, the error rate characteristic of a signal having passed through the DC offset canceller degrades even if no DC offset component exists. The DC offset component is generated at regular intervals [msec] indicated by the horizontal axis of FIG. 7, and the BLER assumed at the demodulator when DPCH_Ec/Ior is −7.5 dB is calculated by simulation.

Specifically, when DPCH_Ec/Ior is −7.5 dB, the BLER of the ideal receiver was about $3.8 \times 10^{-2}$. At this time, if DPCH_Ec/Ior degrades by 0.1 dB into −7.6 dB, the BLER becomes about $4.1 \times 10^{-2}$. In FIG. 7, the LNA shortest gain switching interval α can be set to 2 msec, at which the BLER is about $4.1 \times 10^{-2}$. This value is 7680 times or more as long as the chip rate.

In the above-described simulation conditions, the data rate is the highest rate stipulated in TS25.101, and as aforementioned, the case 1 is the condition under which the degradation of the block error rate is conspicuous. Also in any other test case stipulated in TS25.101, it is confirmed from the simulation that the LNA shortest gain switching interval α obtained by the second method, which is 7680 times or more as long as the chip rate, makes the degradation of the block error rate equal to or lower than 0.1 dB. Thus, the effectiveness of the embodiment is clear irrespective of the data rate or fading conditions.

As described above, it is sufficient if the LNA shortest gain switching interval α of the timing controller 22 satisfies the result of the first or second method.

(A Control Method, According to Another Embodiment, Employed in the Gain Controller 18)

In the above embodiment, a description has been given of the control of the LNA gain switching timing executed in the LNA gain switching signal interval measuring unit 24 of the timing controller 22, the control being executed by comparing the value of α with the time interval Δt between the present and previous occasions of LNA gain switching. However, instead of the time interval Δt, the value of α may be compared with the time interval at which switching signals are input to the LNA gain switching signal interval measuring unit 24, i.e. with the time interval Δτ between the present and previous occasions where the received-signal intensity has crossed the LNA gain switching threshold.

Figure 8:
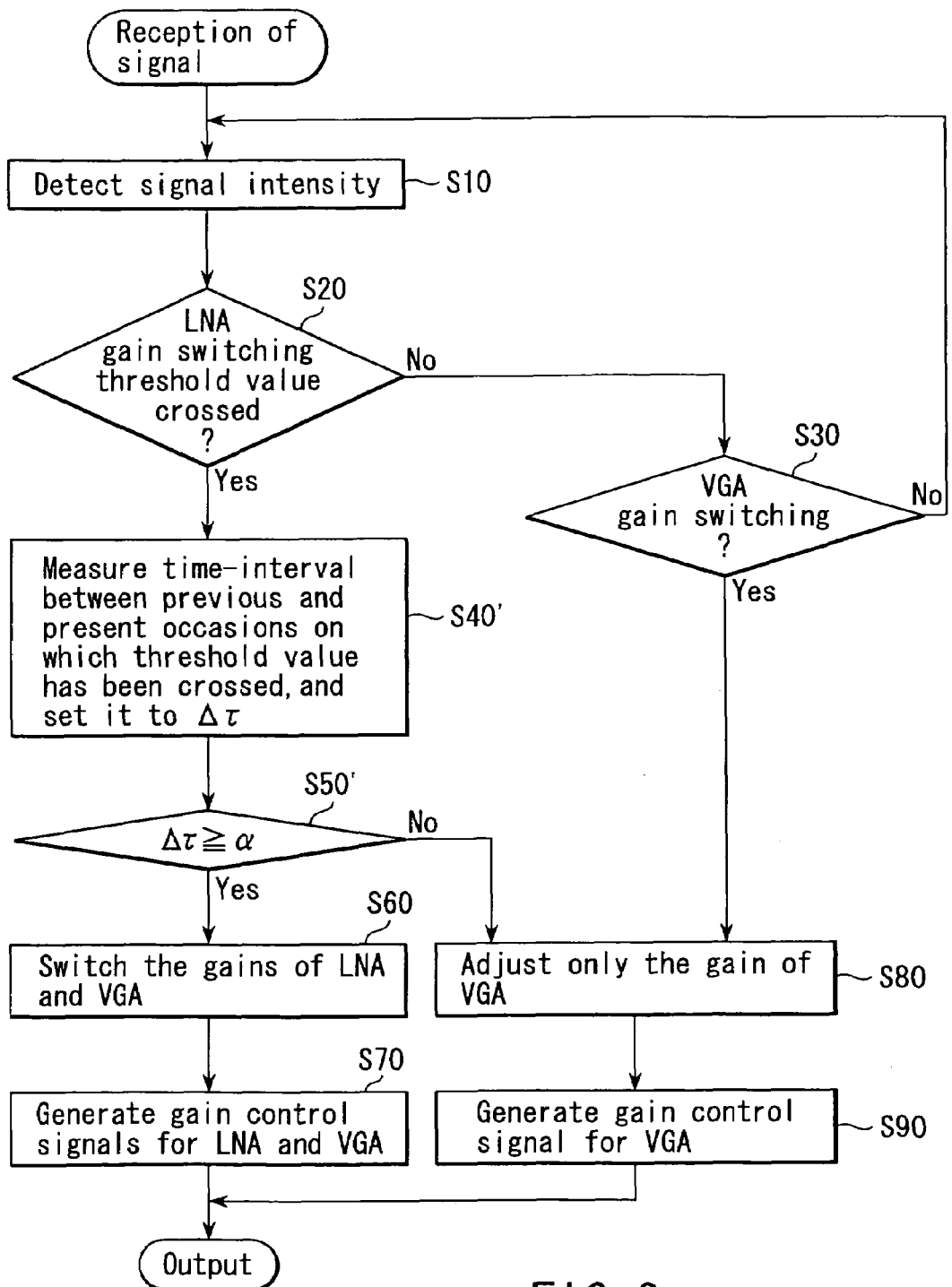
FIG. 8 is a flowchart useful in explaining another example of the control method used in a gain controller appearing in FIG. 1.

FIG. 8 is a flowchart illustrating a control method, according to another embodiment, employed in the gain controller 18. In FIG. 8, steps similar to those of FIG. 4 are denoted by corresponding reference numerals, and are not explained. Only the steps S40' and S50' different from the steps of FIG. 4 will be described. When an LNA gain switching signal has been output from the gain selector 21, the LNA gain switching signal interval measuring unit 24 measures the time interval between the previous and present LNA gain switching signals, and sets the measurement result to Δτ (S40'). By comparing Δτ with α in the gain switching interval comparator 25, it is determined whether or not an LNA gain control signal is to be output (S50').

Figure 9A:
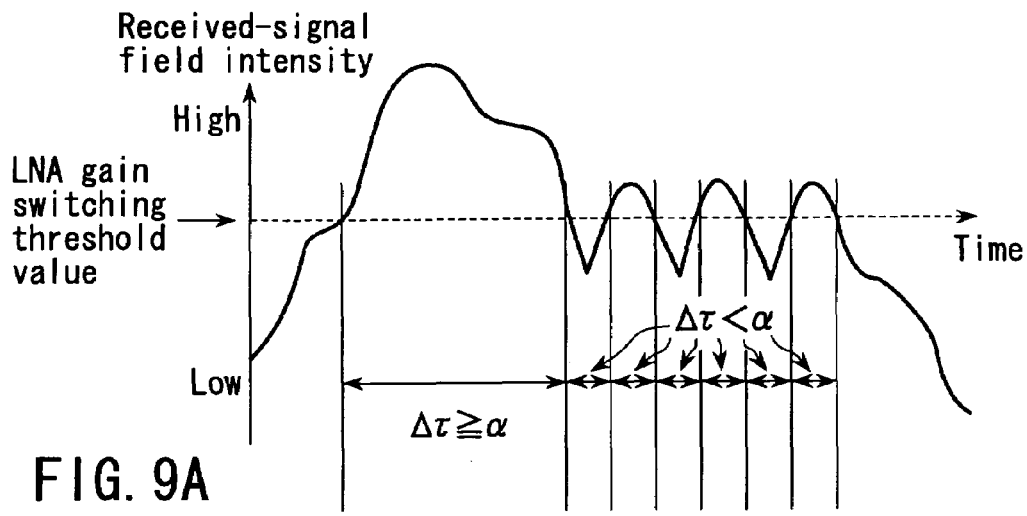
FIGS. 9A, 9B and 9C are views useful in explaining gain control executed by the timing controller upon execution of control shown in FIG. 8.
Figure 9B:
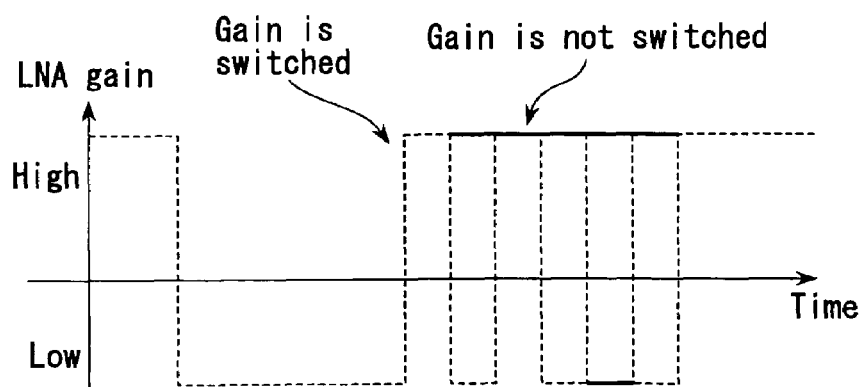
Figure 9C:
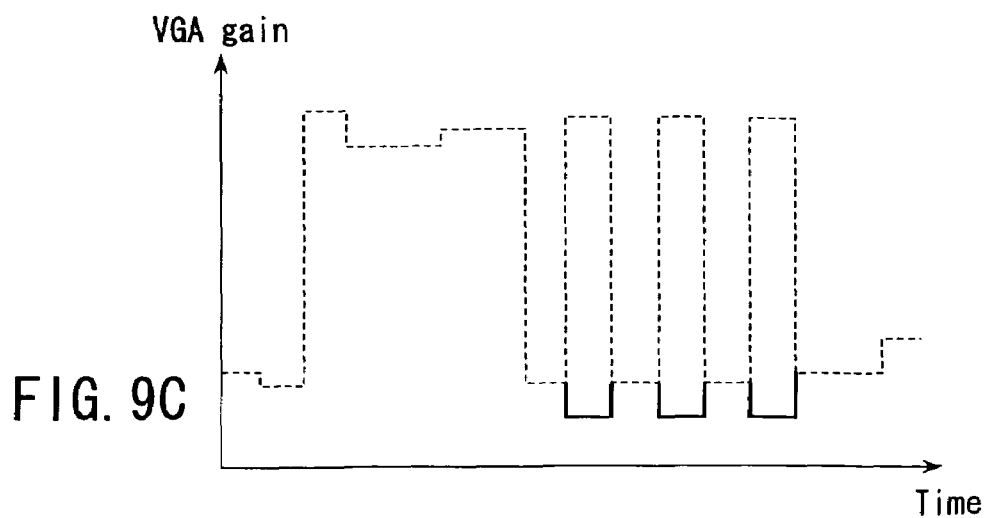

FIGS. 9A, 9B and 9C are views useful in explaining gain control executed by the timing controller upon execution of control illustrated in FIG. 8. Specifically, FIGS. 9A, 9B and 9C show the intensity of a received signal (the output of the VGA 16), the gain of the LNA, and changes, with lapse of time, in the VGA gain, respectively. Since the way of analysis concerning each of FIGS. 9A, 9B and 9C is similar to that concerning a corresponding one of FIGS. 5A, 5B and 5C, see the explanations given of FIGS. 5A, 5B and 5C. As shown in FIGS. 9A, 9B and 9C, if $\Delta\tau \geq \alpha$, the same gain control as in the conventional case is executed. On the other hand, if $\Delta\tau < \alpha$ (NO at the step S50'), control is executed so that a dynamic range of receiving frequencies can be dealt with by switching the gain of the VGA and without switching the gain of the LNA, as is indicated by the solid lines of FIGS. 9A, 9B and 9C.

FIGS. 9A, 9B and 9C show a case where the gain of the LNA is kept high. Even if the LNA gain is not switched, the received-signal intensity is higher than the LNA gain switching threshold value on three occasions. On these three occasions, signals can be prevented from being too much amplified and saturated, by forcibly reducing the gain of the VGA.

Similarly, even if the LNA gain is kept low, signals can be prevented from being insufficiently amplified and hence being unable to be detected (this state is not shown), by forcibly increasing the VGA gain, using an upper margin of about 10 dB and a lower margin of about 10 dB, which are not ordinarily used.

As described above, by virtue of the timing controller of the invention, the time of occurrence of a gain switching signal is controlled to fall within the reception allowable range of the system so that the LNA gain switching is not executed within a predetermined time interval, even if the level of a received signal is close to the LNA gain switching level at which gain switching is frequently executed in the prior art. Further, for the input signal that is received with the gain of the LNA set high in the prior art, the input signal is amplified to a level that can be received by the VGA. On the other hand, for the input signal that is received with the gain of the LNA set low in the prior art, the input signal is attenuated to a level that can be received by the VGA. As a result, a direct-conversion radio receiver is provided, which is free from the problem in which a received signal cannot be demodulated, using the DC offset transient response component of the VGA output, and hence which can suppress, within the allowable range of the radio communication system, degradation of the receiving performance due to the DC offset component of the VGA output.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A radio receiver comprising:
   a low noise amplifier which amplifies a radio signal;
   a quadrature demodulator which demodulates the amplified radio signal into a baseband signal;
   a variable gain amplifier which amplifies the baseband signal;
   an executing unit configured to execute feedback the amplified baseband signal; and
   a first gain controller which controls a first gain of the low noise amplifier and a second gain of the variable gain amplifier, the first gain controller comprising,
   a signal intensity detector which detects an intensity of the amplified baseband signal,
   a gain selector which selects a preset gain from a plurality of preset gains which are set for the low noise amplifier, based on the detected intensity,
   a timing controller which controls timing of switching the first gain and the second gain to the selected preset gain,
   a gain control signal output unit configured to output a gain control signal which controls the first gain according to the selected preset gain at a time-interval according to the controlled timing, and
   a second gain controller which controls the second gain and does not controls the first gain if the time-interval is not longer than a preset time-interval;
   wherein the timing controller comprises,
   a measurement unit configured to measure time when the first gain is switched, and calculate the time-interval elapsing from a previous adjacent time when the first gain was switched to the measured time,
   a comparator configured to compare the time-interval with the preset time-interval, and
   the gain control signal output unit outputs the gain control signal to the low noise amplifier if the time-interval is longer than the preset time-interval.

2. The radio receiver according to claim 1, wherein the preset time-intervalis set such that even if the first gain is switched, a block error rate does not degrade to a degree higher than a maximum allowable block error rate as a standard for a radio communication system.

3. The radio receiver according to claim 1, wherein the preset time-interval is 7680 times or more as long as a chip rate.

4. A radio receiving method comprising:
   amplifying a radio signal using a low noise amplifier;
   demodulating the amplified radio signal into a baseband signal;
   amplifying the baseband signal using a variable gain amplifier;
   executing feedback of the amplified baseband signal;
   controlling a first gain of the low noise amplifier and a second gain of the variable gain amplifier;
   detecting an intensity of the amplified baseband signal;
   selecting a preset gain from a plurality of preset gains which are set for the low noise amplifier, based on the detected intensity;
   controlling timing of switching the first gain of the low noise amplifier and the second gain to the selected preset gain;
   outputting a gain control signal which controls the first gain amplifier according to the selected preset gain at a time-interval according to the controlled timing; and
   controlling the second gain if the time interval is not longer than a present time-interval;
   wherein controlling the timing comprises,
   measuring time when the first gain is switched,
   calculating the time-interval elapsing from a previous adjacent time when the first gain was switched to the measured time,
   comparing the time-interval with the preset time-interval, and
   outputting the gain control signal to the low noise amplifier if the time-interval is longer than the preset time-interval.

* * * * *

UNITED STATES PATENT AND TRADEMARK OFFICE
CERTIFICATE OF CORRECTION

PATENT NO. : 7,515,890 B2  Page 1 of 1
APPLICATION NO. : 11/280331
DATED : April 7, 2009
INVENTOR(S) : Toyoda et al.

It is certified that error appears in the above-identified patent and that said Letters Patent is hereby corrected as shown below:

On the title page, the Terminal Disclaimer information has been omitted. Item (45) and the Notice information should read as follows:

--( 45 ) Date of Patent: * Apr 7, 2009

( * ) Notice: Subject to any disclaimer, the term of this patent is extended or adjusted under 35 U.S.C. 154(b) by 538 days.

This patent is subject to a terminal disclaimer.--

Signed and Sealed this

Twenty-sixth Day of May, 2009

JOHN DOLL
*Acting Director of the United States Patent and Trademark Office*